United States Patent [19]
Jia et al.

[11] Patent Number: 6,165,918
[45] Date of Patent: Dec. 26, 2000

[54] METHOD FOR FORMING GATE OXIDES OF DIFFERENT THICKNESSES

[75] Inventors: James Yingbo Jia, Fremont; Jeong-Yeol Choi, Palo Alto, both of Calif.

[73] Assignee: Integrated Device Technology, Inc., Santa Clara, Calif.

[21] Appl. No.: 09/306,654

[22] Filed: May 6, 1999

[51] Int. Cl.[7] .............................................. H01L 21/8238
[52] U.S. Cl. ...................... 438/981; 438/227; 438/275; 438/228
[58] Field of Search .................................. 438/221, 224, 438/228, 275, 979, 981

[56] References Cited

U.S. PATENT DOCUMENTS

| | | | |
|---|---|---|---|
| 4,516,313 | 5/1985 | Turi et al. .................................. | 29/571 |
| 4,627,153 | 12/1986 | Masuoka .................................... | 29/571 |
| 4,951,112 | 8/1990 | Choi et al. ................................. | 357/41 |
| 5,010,521 | 4/1991 | Matsui ....................................... | 365/189 |
| 5,057,449 | 10/1991 | Lowrey et al. ............................ | 437/60 |
| 5,254,489 | 10/1993 | Nakata ....................................... | 437/40 |
| 5,285,096 | 2/1994 | Ando et al. ............................... | 257/379 |
| 5,293,336 | 3/1994 | Ishii et al. ................................. | 365/149 |
| 5,314,834 | 5/1994 | Mazure et al. ............................ | 437/43 |
| 5,327,002 | 7/1994 | Motoyoshi ................................. | 257/380 |
| 5,330,920 | 7/1994 | Soleimani et al. ........................ | 437/24 |
| 5,347,152 | 9/1994 | Sundaresan ............................... | 257/304 |
| 5,426,065 | 6/1995 | Chan et al. ................................ | 437/52 |
| 5,432,114 | 7/1995 | O ............................................... | 437/56 |
| 5,497,021 | 3/1996 | Tada .......................................... | 257/369 |
| 5,595,922 | 1/1997 | Tigelaar et al. ........................... | 437/40 |
| 5,668,035 | 9/1997 | Fang et al. ................................ | 438/239 |
| 5,691,217 | 11/1997 | Honeycutt ................................. | 437/47 |
| 5,705,418 | 1/1998 | Liu ............................................. | 437/46 |
| 5,716,863 | 2/1998 | Arai ........................................... | 438/238 |
| 5,723,355 | 3/1998 | Chang et al. .............................. | 437/56 |
| 5,731,219 | 3/1998 | Ikeda et al. ............................... | 437/52 |
| 5,926,729 | 7/1999 | Tsai et al. .................................. | 438/591 |
| 6,033,958 | 3/2000 | Chou et al. ................................ | 438/275 |
| 6,040,223 | 3/2000 | Liu et al. ................................... | 438/303 |

FOREIGN PATENT DOCUMENTS

| | | |
|---|---|---|
| 08131979 | 5/1996 | Japan . |
| 9321148 | 5/1996 | Japan . |
| 08176320 | 7/1996 | Japan . |
| 10022397 | 7/1996 | Japan . |
| 09321148 | 12/1997 | Japan . |
| 10022397 | 1/1998 | Japan . |

*Primary Examiner*—Charles Bowers
*Assistant Examiner*—William M. Brewster
*Attorney, Agent, or Firm*—Bever, Hoffman & Harms, LLP

[57] ABSTRACT

Systems and methods are described for fabricating semiconductor gate oxides of different thicknesses. Two methods for forming gate oxides of different thicknesses in conjunction with local oxidation of silicon (LOCOS) are disclosed. Similarly, two methods for forming gate oxides of different thicknesses in conjunction with shallow trench isolation (STI) are disclosed. Techniques that use two poly-silicon sub-layers of substantially equal thickness and techniques that use two poly-silicon sub-layers of substantially unequal thickness are described for both LOCOS and STI. The systems and methods provide advantages because gate uniformity and quality are improved, the processes and resulting devices are cleaner, and there is less degradation of carrier mobility.

14 Claims, 6 Drawing Sheets

METHOD FOR FORMING GATE OXIDES OF DIFFERENT THICKNESSES

BACKGROUND OF THE INVENTION

1. Field of the Invention

The invention relates generally to the field of semiconductor fabrication. More particularly, the invention relates to forming gate oxides of different thicknesses.

2. Discussion of the Related Art

Prior art transistor gate oxides are well known to those skilled in the art. In the past, gate oxides of different thicknesses have been formed on a single wafer.

A conventional way to achieve two different gate oxide thicknesses on a single wafer is to grow an oxide with certain thickness and selectively etch certain regions. A second oxide growth is performed after the etch. Regions that were previously etched will exhibit a thinner resulting oxide. Those regions that were not etched will exhibit a thicker resulting oxide.

Another conventional way to vary the gate oxide thickness on a single wafer is to implant nitrogen into the gate region before gate oxidation. The oxidation growth rate depends on the nitrogen implant dose. By selectively exposing some gate regions to the nitrogen implantation, different oxide thickness can be obtained.

The first art approach has a surface cleanliness problem due to direct contact of the gate oxide with photoresist. The second approach also has a uniformity problem with regard to nitrogen dopant concentration. Variations in nitrogen concentration cause unwanted variations in the resulting gate oxide thicknesses. The second approach also has a problem with regard to stray nitrogen in the channel region, (which is near the gate oxide region) degrades carrier mobility.

Heretofore, with regard to formation of gate oxides of different thicknesses, the requirements of cleanliness, uniformity, and avoidance of carrier mobility degradation have not been fully met. What is needed is a solution that simultaneously addresses all of these requirements.

SUMMARY OF THE INVENTION

A primary goal of the invention is to provide different gate oxide thicknesses while maintaining cleanliness. Another primary goal of the invention is to provide different gate oxide thicknesses while maintaining uniformity. Another primary goal of the invention is to provide different gate oxide thicknesses without degrading carrier mobility.

In accordance with these goals, there is a particular need for a better approach to forming gate oxides of different thicknesses. Thus, it is rendered possible to simultaneously satisfy the above-discussed requirements of different gate oxide thicknesses, cleanliness, uniformity, and avoidance of carrier mobility degradation which, in the case of the prior art, are mutually contradicting and cannot be simultaneously satisfied.

A first aspect of the invention is implemented in an embodiment that is based on a method for forming gate oxides of different thicknesses, comprising: growing a first gate oxidation sub-layer precursor on a silicon substrate having a first gate region separated from a second gate region by a local oxidation of silicon field; depositing a first layer of poly-silicon on said first gate oxidation sub-layer precursor; masking a first portion of said first layer of poly-silicon that overlies both i) a first portion of said first gate oxidation sub-layer precursor and ii) said first gate region; removing a) a second portion of said first layer of poly-silicon that overlies both a second portion of said first gate oxidation sub-layer precursor and said second gate region so as to form a first poly-silicon sub-layer and b) at least a fraction of a thickness of said second portion of said first gate oxidation sub-layer precursor that overlies said second gate region so as to form a first gate oxidation sub-layer; growing a second gate oxidation sub-layer precursor on both i) said first poly-silicon sub-layer and ii) a portion of said first gate oxidation sub-layer that overlies said second gate region; depositing a second layer of poly-silicon on said second gate oxidation sub-layer precursor; masking a first portion of said second layer of poly-silicon that overlies said second gate region; removing a second portion of said second layer of poly-silicon that overlies said first gate region so as to form a second poly-silicon sub-layer, said first poly-silicon sub-layer and said second poly-silicon sub-layer together composing a poly-silicon layer; and removing a portion of said second gate oxidation sub-layer precursor that overlies said first gate region so as to form a second gate oxidation sub-layer, said first gate oxidation sub-layer and said second gate oxidation sub-layer together composing a gate oxidation layer having gate oxides of different thicknesses.

A second aspect of the invention is implemented in an embodiment that is based on a method for forming gate oxides of different thicknesses, comprising: growing a first gate oxidation sub-layer precursor on a silicon substrate having a first gate region separated from a second gate region by an oxide filled trench; forming a first layer of poly-silicon on said first gate oxidation sub-layer; masking a first portion of said first layer of poly-silicon that overlies both i) a first portion of said first gate oxidation sub-layer precursor and ii) said first gate region; removing a) a second portion of said first layer of poly-silicon that overlies both a second portion of said first gate oxidation sub-layer precursor and said second gate region so as to form a first poly-silicon sub-layer and b) at least a fraction of a thickness of said second portion of said first gate oxidation sub-layer precursor that overlies said second gate region so as to form a first gate oxidation sub-layer; growing a second gate oxidation sub-layer precursor i) on said first poly-silicon sub-layer ii) and over said second gate region; forming a second layer of poly-silicon on said second gate oxidation sub-layer precursor; removing a portion of said second layer of poly-silicon that overlies said first gate region by chemical mechanical polishing so as to form a second poly-silicon sub-layer, said first poly-silicon sub-layer and said second poly-silicon sub-layer together composing a poly-silicon layer; and removing a portion of said second gate oxidation sub-layer precursor that overlies said first gate region so as to form a second gate oxidation sub-layer, said first gate oxidation sub-layer and said second gate oxidation sub-layer together composing a gate oxidation layer.

A third aspect of the invention is implemented in an embodiment that is based on a method for forming gate oxides of different thicknesses, comprising: growing a first gate oxidation sub-layer precursor on a silicon substrate having a first gate region separated from a second gate region by a local oxidation of silicon field; depositing a first layer of poly-silicon on said first gate oxidation sub-layer precursor; depositing a layer of silicon nitride on said first layer of poly-silicon; masking a first portion of said layer of silicon nitride that overlies i) a first portion of said first layer of poly-silicon, ii) a first portion of said first gate oxidation sub-layer precursor and iii) said first gate region; removing a) a second portion of said layer of silicon nitride that overlies said second gate region, b) a second portion of said first layer of poly-silicon that overlies said second gate region to form a first poly-silicon sub-layer and c) at least a fraction of a thickness of a second portion of said first gate oxidation sub-layer precursor that overlies said second gate region so as to form a first gate oxidation sub-layer; growing a second gate oxidation sub-layer on a portion of said first gate oxidation sub-layer that overlies said second gate region, said first gate oxidation sub-layer and said second gate oxidation sub-layer together composing a gate oxidation layer having gate oxides of different thicknesses; removing said first portion of said layer of silicon nitride; and depositing a second poly-silicon sub-layer on said second gate oxidation sub-layer and said first poly-silicon sub-layer, said first poly-silicon sub-layer and said second poly-silicon sub-layer together composing a poly-silicon layer.

A fourth aspect of the invention is implemented in an embodiment that is based on a method for forming gate oxides of different thicknesses, comprising: growing a first gate oxidation sub-layer precursor on a silicon substrate having a first gate region separated from a second gate region by an oxide filled trench; forming a first layer of poly-silicon on said first gate oxidation sub-layer precursor; forming a layer of silicon nitride on said first layer of poly-silicon; masking a first portion of said layer of silicon nitride that overlies i) a first portion of said first layer of poly-silicon, ii) a first portion of said first gate oxidation sub-layer precursor and iii) said first gate region; removing a) a second portion of said layer of silicon nitride that overlies a second portion of said first layer of poly-silicon, b) said second portion of said first layer of poly-silicon that overlies a second portion of said first gate oxidation sub-layer precursor and c) at least a fraction of a thickness of said second portion of said first gate oxidation sub-layer precursor that overlies said second gate region so as to form a first gate oxidation sub-layer; growing a second gate oxidation sub-layer over said second gate region, said first gate oxidation sub-layer and said second gate oxidation sub-layer together composing a gate oxidation layer having different thicknesses; removing said layer of silicon nitride; forming a second poly-silicon sub-layer on both said second gate oxidation sub-layer and said first poly-silicon sub-layer, said first poly-silicon sub-layer and said second poly-silicon sub-layer together composing a poly-silicon layer.

These, and other, goals and aspects of the invention will be better appreciated and understood when considered in conjunction with the following description and the accompanying drawings. It should be understood, however, that the following description, while indicating preferred embodiments of the invention and numerous specific details thereof, is given by way of illustration and not of limitation. Many changes and modifications may be made within the scope of the invention without departing from the spirit thereof, and the invention includes all such modifications.

BRIEF DESCRIPTION OF THE DRAWINGS

A clear conception of the advantages and features constituting the invention, and of the components and operation of model systems provided with the invention, will become more readily apparent by referring to the exemplary, and therefore nonlimiting, embodiments illustrated in the drawings accompanying and forming a part of this specification, wherein like reference characters designate the same parts. It should be noted that the features illustrated in the drawings are not necessarily drawn to scale.

DESCRIPTION OF PREFERRED EMBODIMENTS

The invention and the various features and advantageous details thereof are explained more fully with reference to the nonlimiting embodiments that are illustrated in the accompanying drawings and detailed in the following description of preferred embodiments. Descriptions of well known components and processing techniques are omitted so as not to unnecessarily obscure the invention in detail.

In large scale metal oxide semiconductor (MOS) integrated circuits (ICs), metal oxide semiconductor field effect transistors (MOSFETs) with different performance are required. By implementing different gate oxide thickness in the same chip, the resulting metal oxide semiconductor integrated circuits can be more flexible for different applications.

The context of the invention includes integrated circuit fabrication processes that include local oxidation of silicon and/or shallow trench isolation. This context includes local oxidation of silicon (LOCOS) and shallow trench isolation (STI) devices with different gate oxide thicknesses. The invention can also utilize data processing methods that transform processing feedback signals so as to actuate interconnected discrete hardware elements; for example, to start or stop a step of deposition, or to start or stop a step of masking, or to start or stop a step of etching.

The invention includes protecting some gate oxides with poly-silicon before etching. With regard to local oxidation of silicon, the invention includes both an approach that uses two oxide layers of substantially identical thickness and an approach that uses two oxide layers of substantially different thickness. With regard to shallow trench isolation, again, the invention includes both an approach that uses two oxide layers of substantially equal thickness and an approach that uses two oxide layers of substantially different thickness.

The term coupled, as used herein, is defined as connected, although not necessarily directly, and not necessarily mechanically. The term precursor, as used herein, is defined as a structure that is to be further processed, for example, by being reduced in area and/or thickness with an etchant. The term sub-layer, as used herein, is defined as a subcomponent of a larger layer, optionally with various chemistries, morphologies and/or structures. The term substantially, as used herein, is defined as approximately (e.g., preferably within 10% of, more preferably within 1% of, most preferably within 0.1% of).

Four different embodiments of the invention will now be described. The first and second embodiments include two poly-silicon deposition steps of substantially similar thickness. The third and fourth embodiments include two poly-silicon deposition steps of substantially different thicknesses (e.g., one step can produce a poly-silicon deposition layer that is very thin).

First Embodiment

Figure 1:
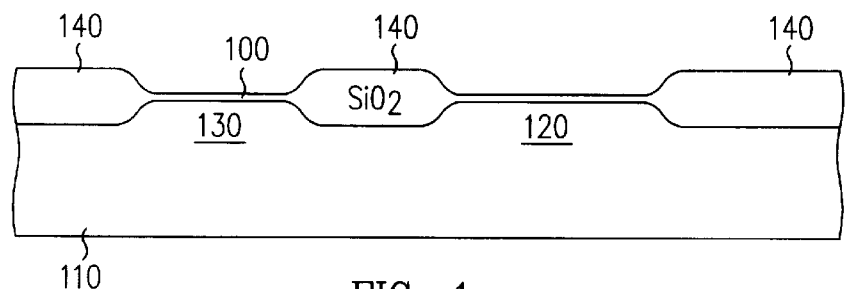
FIG. 1 illustrates a schematic view of a first step of gate oxidation, representing an embodiment of the invention.

FIGS. 1–6 depict an implementation of the invention to achieve local oxidation of silicon (LOCOS) isolation. FIG. 1 depicts growing a first gate oxidation sub-layer precursor 100 on a substrate 110 having a first gate region 120 separated from a second gate region 130 by a local oxidation of silicon field 140. The substrate 110 can include silicon or any other suitable semiconductor substrate material.

Figure 2:
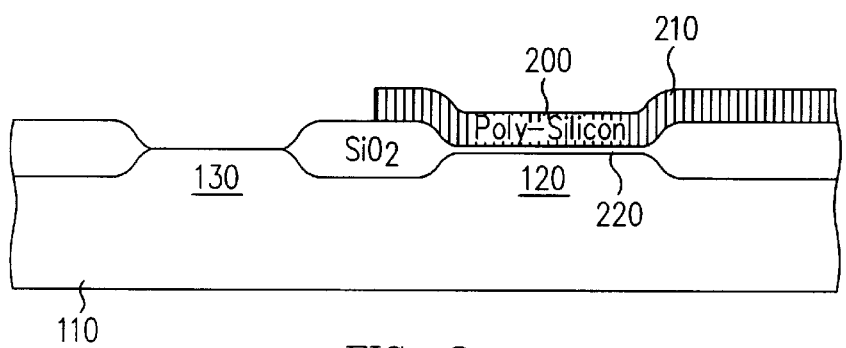
FIG. 2 illustrates a schematic view of a sequence of steps including poly-silicon deposition, poly-silicon masking, poly-silicon etching and then oxide etching, representing an embodiment of the invention.

FIG. 2 shows the LOCOS device after a number of processing steps. These steps include depositing a first layer of poly-silicon on the first gate oxidation sub-layer precursor. Only the portion of this first layer of poly-silicon that remains is shown in FIG. 2. It can also be appreciated that only a portion of the first gate oxidation sub-layer precursor remains in FIG. 2. These steps also include masking a first portion of the first layer of poly-silicon 200 that overlies both i) a first portion of the first gate oxidation sub-layer precursor and ii) the first gate region 120. The mask layer is not shown in FIG. 2. These steps also include removing a) a second portion of the first layer of poly-silicon that overlies both a second portion of the first gate oxidation sub-layer precursor and the second gate region 130 so as to form a first poly-silicon sub-layer 210 and b) at least a fraction of a thickness of the second portion of the first gate oxidation sub-layer precursor that overlies the second gate region 130 so as to form a first gate oxidation sub-layer 220. The masking can be effected with a photoresist. The poly-silicon not covered by the mask can be etched away. Then the gate oxide not covered by poly-silicon can be etched away.

Figure 3:
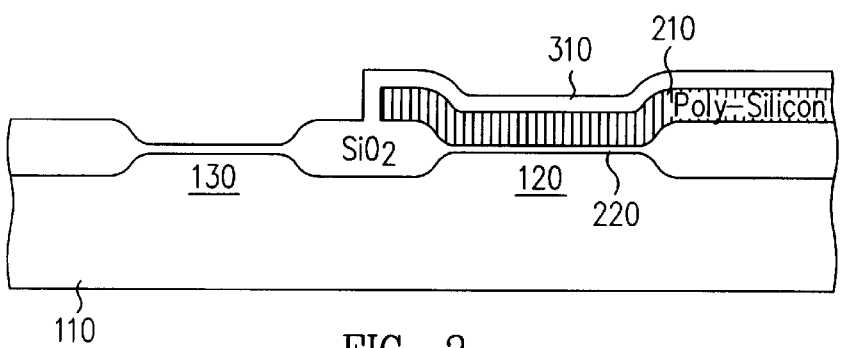
FIG. 3 illustrates a schematic view of a second step of gate oxidation, representing an embodiment of the invention.

FIG. 3 depicts growing a second gate oxidation sub-layer precursor 310 on both i) the first poly-silicon sub-layer 210 and ii) a portion of the first gate oxidation sub-layer 220 that overlies the second gate region 130. The second gate oxidation sub-layer precursor should be of a different thickness than the first gate oxidation sub-layer precursor.

Figure 4:
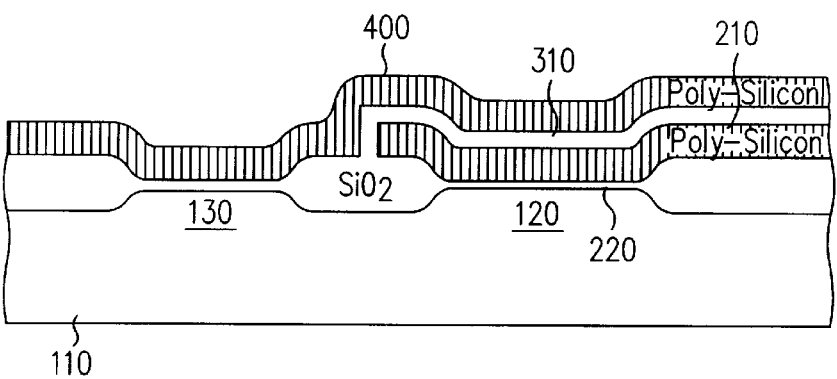
FIG. 4 illustrates a schematic view of a step of poly-silicon deposition, representing an embodiment of the invention.

FIG. 4 depicts forming a second layer of poly-silicon 400 on the second gate oxidation sub-layer precursor 310. The second layer of poly-silicon can be conformably deposited to result in the structure shown in FIG. 4. Although the second layer of poly-silicon should be substantially equal in thickness to the first layer of poly-silicon, in this embodiment, the first layer of poly-silicon may advantageously be made a little thicker due to the presence of the second gate oxidation sub-layer precursor 310.

Figure 5:
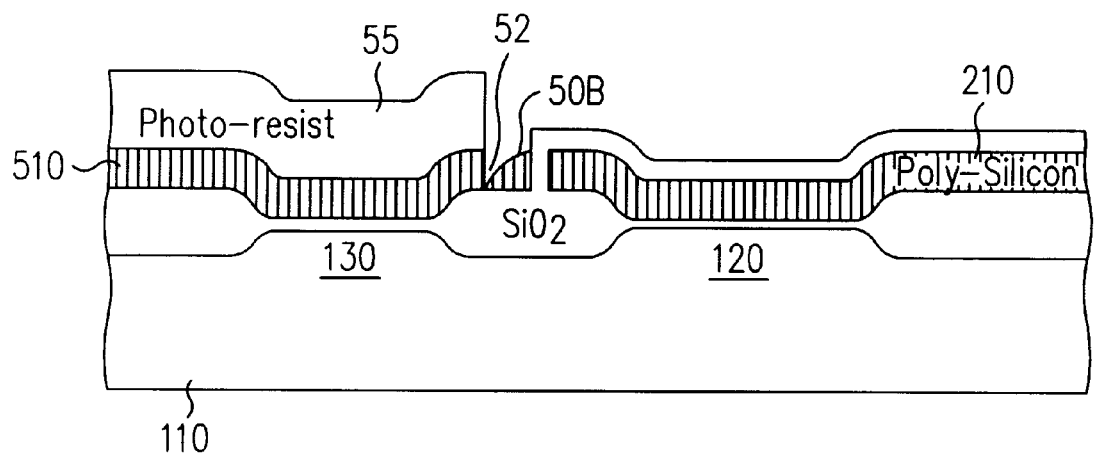
FIG. 5 illustrates a schematic view of a sequence of steps including poly-silicon masking and poly-silicon etching, representing an embodiment of the invention.

FIG. 5 shows the LOCOS device after a number of additional processing steps. These additional processing steps include masking a first portion of the second layer of poly-silicon that overlies the second gate region 130 with a mask 55. The mask 55 in FIG. 5 protects the underlying poly-silicon. The mask 55 can be a photoresist. These additional processing steps also include removing a second portion of the second layer of poly-silicon that overlies the first gate region 120 so as to form a second poly-silicon sub-layer 510. The second portion of the second layer of poly-silicon can be etched away. In this case, the unmasked poly-silicon is etched away except for portion 50B. Oxide on poly-silicon can be used as an etch-stop layer. A gap 52 may be formed at the mask edge. The first poly-silicon sub-layer 210 and the second poly-silicon sub-layer 510 together compose a poly-silicon layer.

Figure 6:
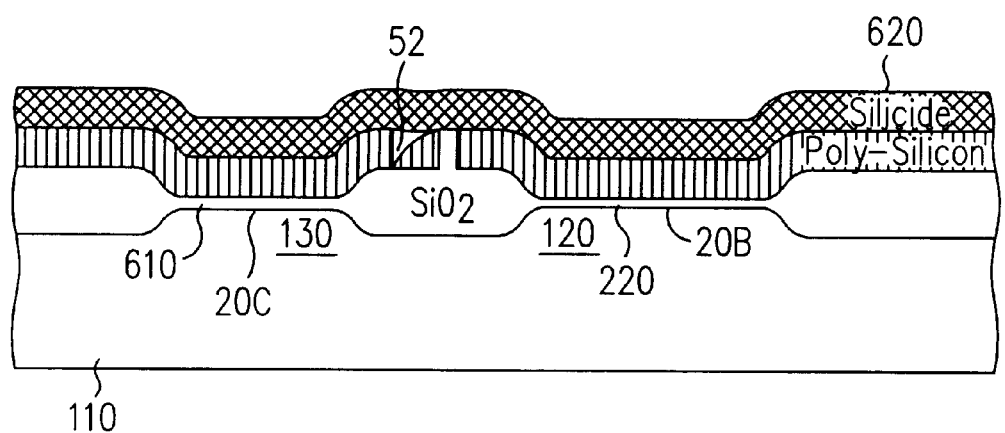
FIG. 6 illustrates a schematic view of a sequence of steps including oxide deposition, oxide etch-back and then silicide formation, representing an embodiment of the invention.

Referring to FIG. 6, it can be appreciated that the gap 52 can be filled with oxide. FIG. 6 depicts removing a portion of the second gate oxidation sub-layer precursor that overlies the first gate region 120 so as to form a second gate oxidation sub-layer 610. These oxides can be etched back to the upper surface of the gap 52. Filling the gap 52 with oxide and then etching-back the gap oxide can be an optional step. The first gate oxidation sub-layer 220 and the second gate oxidation sub-layer 610 together compose a gate oxidation layer having gate oxides of different thicknesses.

Thereafter, a layer of suicide 620 can be formed by depositing a layer of metal and then heating to produce the structure shown in FIG. 6. The deposition of metal and heating are optional steps. The resulting structure has a first gate oxide 20B that is thinner than a second gate oxide 20C. However, in this embodiment, either gate oxide can be the thin one.

Second Embodiment

Figure 7:
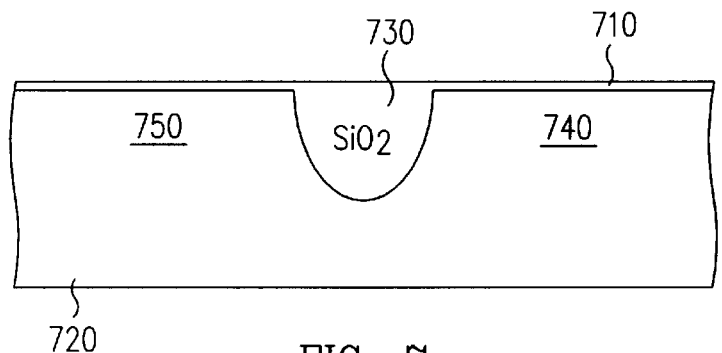
FIG. 7 illustrates a schematic view of a first step of gate oxidation, representing an embodiment of the invention.

FIGS. 7–12 depict an implementation of the invention to achieve shallow trench isolation (STI). FIG. 7 depicts growing a first gate oxidation sub-layer precursor 710 on a substrate 720 having a first gate region 740 separated from a second gate region 750 by an oxide filled trench 730. The substrate 720 can include silicon or any other suitable semiconductor substrate material. After the trench 730 is filled with oxide, the oxide can be polished back to a smooth surface, before the first gate oxidation sub-layer precursor 710 is grown.

Figure 8:
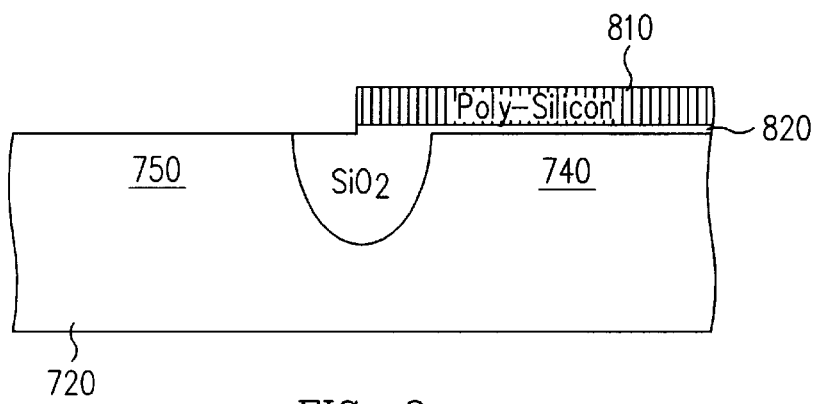
FIG. 8 illustrates a schematic view of a sequence of steps including poly-silicon deposition, poly-silicon masking, poly-silicon etching and then oxide etching, representing an embodiment of the invention.

FIG. 8 depicts the STI device after a number of additional processing steps. These processing steps include forming a first layer of poly-silicon on the first gate oxidation sub-layer precursor. The first layer of poly-silicon can be formed by deposition. These processing steps also include masking a first portion of the first layer of poly-silicon that overlies both i) a first portion of the first gate oxidation sub-layer precursor and ii) the first gate region 740. The masking can be done with photoresist. These steps also include removing a second portion of the first layer of poly-silicon that overlies both a second portion of the first gate oxidation sub-layer precursor and the second gate region 750 so as to form a first poly-silicon sub-layer 810. The removal of poly-silicon can be done with etchant. These steps also include removing at least a fraction of a thickness of the second portion of the first gate oxidation sub-layer precursor that overlies the second gate region so as to form a first gate oxidation sub-layer 820. Oxide not covered by poly-silicon is etched away. This removal of oxide can also be done with etchant.

Figure 9:
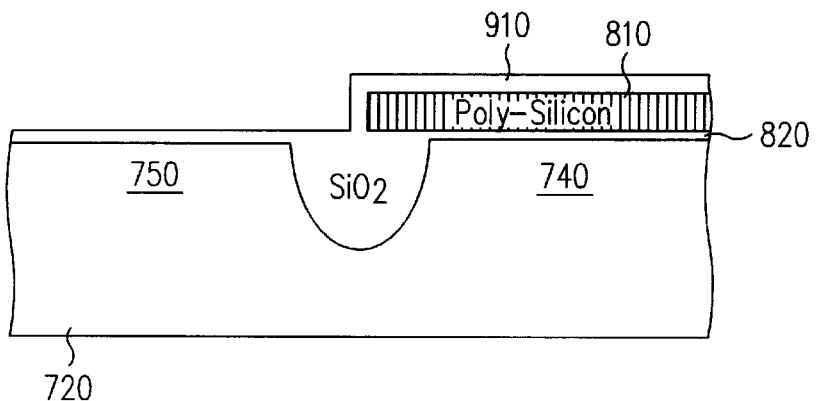
FIG. 9 illustrates a schematic view of a second step of gate oxidation, representing an embodiment of the invention.

FIG. 9 depicts growing a second gate oxidation sub-layer precursor 910 on the first poly-silicon sub-layer 810 and over the second gate region 750. The second gate oxidation sub-layer precursor 910 should be a different thickness than the first gate oxidation sub-layer 820.

Figure 10:
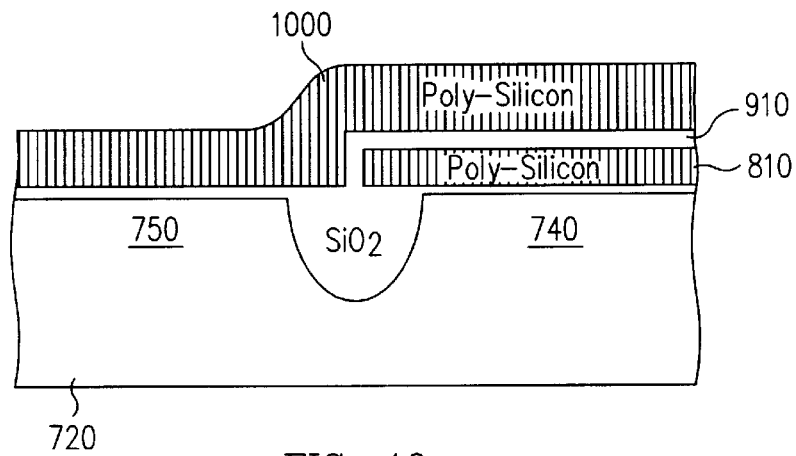
FIG. 10 illustrates a schematic view of a step of poly-silicon deposition, representing an embodiment of the invention.

FIG. 10 depicts forming a second layer of poly-silicon 1000 on the second gate oxidation sub-layer precursor 910. The poly-silicon can be formed by deposition. In this embodiment, the second layer of poly-silicon should be substantially equal in thickness to the first layer of poly-silicon.

Figure 11:
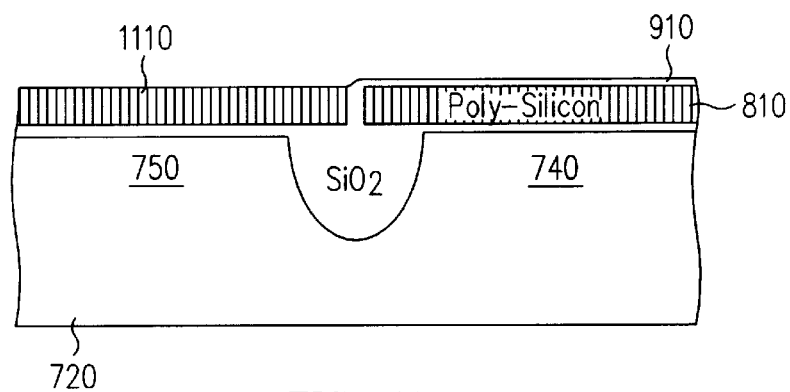
FIG. 11 illustrates a schematic view of a step of poly-silicon chemical mechanical polishing representing an embodiment of the invention.

FIG. 11 depicts the STI device after removing a portion of the second layer of poly-silicon that overlies the first gate region by chemical mechanical polishing so as to form a second poly-silicon sub-layer 1110. The second gate oxidation sub-layer precursor 910 acts as a polish-stop guiding the endpoint at which polishing should cease. The first poly-silicon sub-layer 810 and the second poly-silicon sub-layer 1110 together compose a poly-silicon layer.

Figure 12:
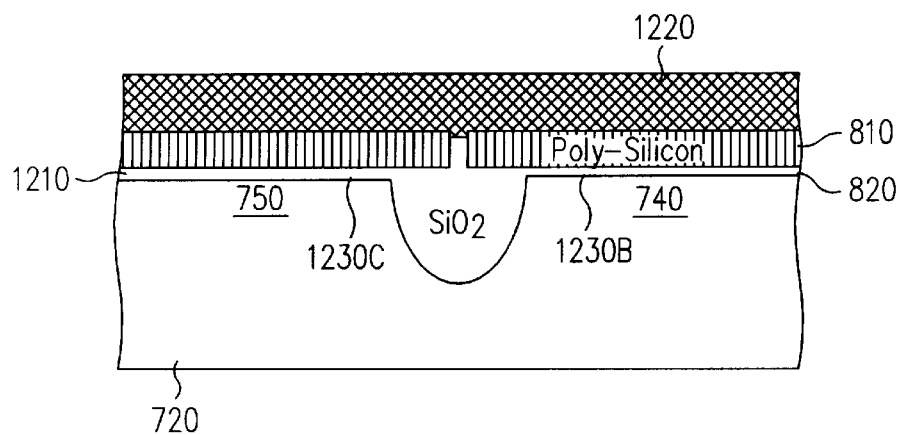
FIG. 12 illustrates a schematic view of a sequence of steps including oxide etching and then silicide formation, representing an embodiment of the invention.

FIG. 12 depicts the STI device after a number of additional processing steps. These processing steps include removing a portion of the second gate oxidation sub-layer precursor that overlies the first gate region so as to form a second gate oxidation sub-layer 1210. The portion of the second gate oxidation sub-layer on top of the poly-silicon that is removed can be etched away. It can be appreciated that a vertical web of oxide remains between the first poly-silicon sub-layer 810 and the second poly-silicon sub-layer 1110. Together, the first gate oxidation sub-layer 820 and the second gate oxidation sub-layer 1210 compose a gate oxidation layer having gate oxides of different thicknesses.

Thereafter, a layer of silicide 1220 can be formed by depositing a layer of metal and then heating to produce the structure shown in FIG. 12. The deposition of metal and heating are optional steps. As a result, two gate oxides with two different thicknesses are formed. In this embodiment, the resulting structure has a first gate oxide 1230B that is thinner than a second gate oxide 1230C. However, in this embodiment, either gate oxide can be the thick one.

Third Embodiment

Figure 13:
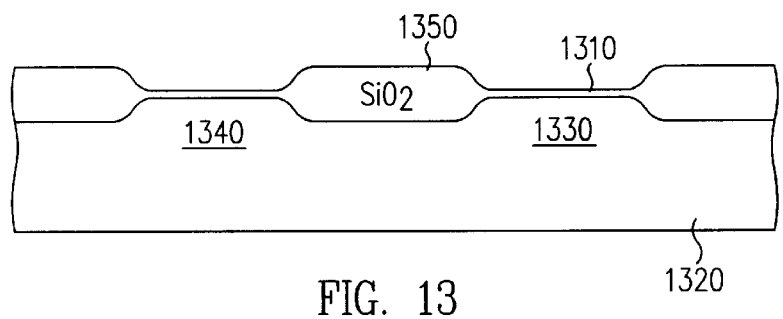
FIG. 13 illustrates a schematic view of a first step of gate oxidation, representing an embodiment of the invention.

FIGS. 13–16 depict an implementation of the invention to achieve local oxidation of silicon (LOCOS) isolation. FIG. 13 depicts growing a first gate oxidation sub-layer precursor 1310 on a substrate 1320 having a first gate region 1330 separated from a second gate region 1340 by a local oxidation of silicon field 1350. The substrate 1320 can include silicon or any other suitable semiconductor substrate material.

Figure 14:
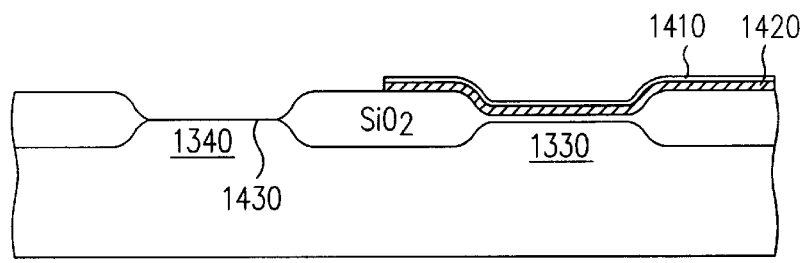
FIG. 14 illustrates a schematic view of a sequence of steps including poly-silicon deposition, silicon nitride deposition, silicon nitride masking, silicon nitride etching, poly-silicon etching and then oxide etching, representing an embodiment of the invention.

FIG. 14 depicts the LOCOS structure after a number of additional steps. These additional steps includes depositing a first layer of poly-silicon on the first gate oxidation sub-layer precursor 1310. These additional steps also include depositing a layer of silicon nitride on the first layer of poly-silicon. These additional steps also include masking a first portion of the layer of silicon nitride 1410 that overlies i) a first portion of the first layer of poly-silicon 1420, ii) a first portion of the first gate oxidation sub-layer precursor and iii) the first gate region 1330. These additional steps further include removing a) a second portion of the layer of silicon nitride that overlies the second gate region 1340, b) a second portion of the first layer of poly-silicon that overlies the second gate region 1340 to form the first poly-silicon sub-layer 1420 and c) at least a fraction of a thickness of a second portion of the first gate oxidation sub-layer precursor that overlies the second gate region so as to form a first gate oxidation sub-layer 1430. Removing the second portion of the layer of silicon nitride can include etching. Similarly, removing the second portion of the first layer of poly-silicon and/or the fraction of the thickness of the second portion of the first gate oxidation sub-layer precursor can include etching.

Figure 15:
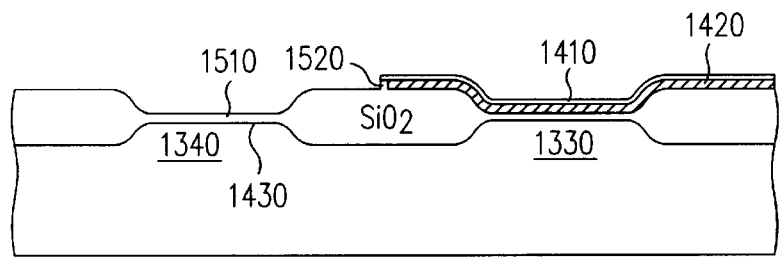
FIG. 15 illustrates a schematic view of a second step of gate oxidation, representing an embodiment of the invention.

FIG. 15 depicts growing a second gate oxidation sub-layer 1510 on a portion of the first gate oxidation sub-layer 1430 that overlies the second gate region 1340, the first gate oxidation sub-layer 1430 and the second gate oxidation sub-layer 1510 together composing a gate oxidation layer having gate oxides of different thicknesses. In this embodiment, the second gate oxidation sub-layer 1510 should be thicker than the first gate oxidation sub-layer 1430 to help prevent over etching during gate formation. Due to the protection function of the layer of silicon nitride 1410, no oxidation occurs on the upper surface of the first poly-silicon sub-layer 1420. It can be appreciated that the growth of the second gate oxidation sub-layer 1510 in this embodiment results in the formation of a web of silicon oxide 1520 that rises from the local oxidation of silicon field 1350 toward the layer of silicon nitride 1410 due to oxidation of the exposed edge of the first poly-silicon sub-layer 1420.

Figure 16:
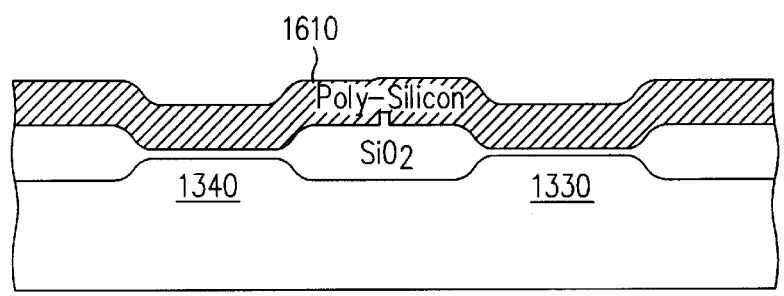
FIG. 16 illustrates a schematic view of a sequence of steps including silicon nitride stripping and then poly-silicon deposition, representing an embodiment of the invention.

FIG. 16 depicts the LOCOS device after several additional processing steps. These additional processing steps include removing the first portion of the layer of silicon nitride 1410. These additional steps also include depositing a second poly-silicon sub-layer on the second gate oxidation sub-layer and the first poly-silicon sub-layer, the first poly-silicon sub-layer and the second poly-silicon sub-layer together composing a poly-silicon layer 1610. In this embodiment, the second poly-silicon sub-layer should be thicker than the first poly-silicon sub-layer; it can be advantageous to make the first poly-silicon sub-layer as thin as practical (possible). The resulting structure has two gate oxide thicknesses.

A layer of silicide (not shown) can be formed by depositing a layer of metal on top of the poly-silicon layer 1610 and then heating to produce the silicide. The deposition of metal and heating are optional steps.

Fourth Embodiment

Figure 17:
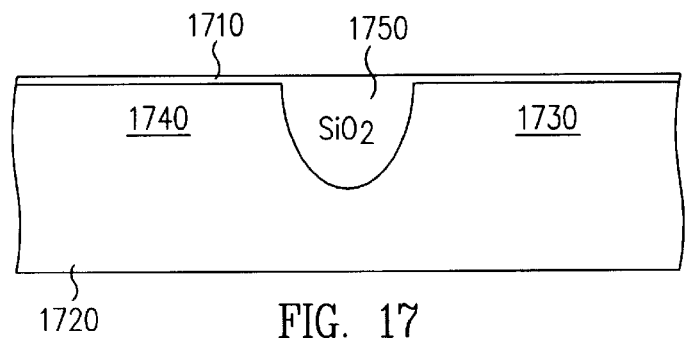
FIG. 17 illustrates a schematic view of a first step of gate oxidation, representing an embodiment of the invention.

FIGS. 17–20 depict an implementation of the invention to achieve shallow trench isolation (STI). FIG. 17 depicts growing a first gate oxidation sub-layer precursor 1710 on a substrate 1720 having a first gate region 1730 separated from a second gate region 1740 by an oxide filled trench 1750. After trench is filled with oxide, the oxide can be polished back to a smooth surface.

Figure 18:
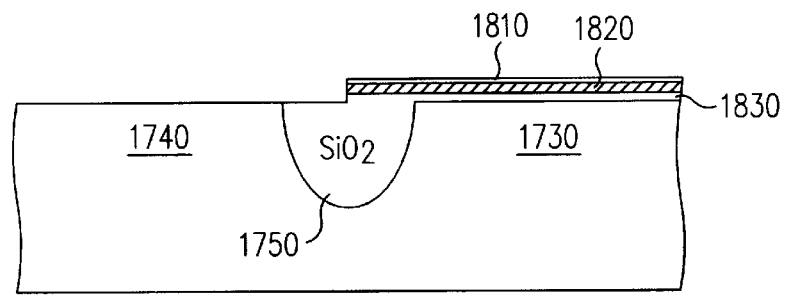
FIG. 18 illustrates a schematic view of a sequence of steps including poly-silicon deposition, silicon-nitride deposition, masking the silicon-nitride, silicon-nitride etching, and poly-silicon etching and then etching oxide, representing an embodiment of the invention.

FIG. 18 depicts the STI device after a number of additional processing steps. These additional processing steps include forming a first layer of poly-silicon on the first gate oxidation sub-layer precursor. These additional steps also include forming a layer of silicon nitride on the first layer of poly-silicon. These steps also include masking a first portion of the layer of silicon nitride 1810 that overlies i) a first portion of the first layer of poly-silicon 1820, ii) a first portion of the first gate oxidation sub-layer precursor and iii) the first gate region 1730. These steps also include removing a) a second portion of the layer of silicon nitride that overlies a second portion of the first layer of poly-silicon, b) the second portion of the first layer of poly-silicon that overlies a second portion of the first gate oxidation sub-layer precursor and c) at least a fraction of a thickness of the second portion of the first gate oxidation sub-layer precursor that overlies the second gate region 1740 so as to form a first gate oxidation sub-layer 1830. In this way, oxide not covered by poly-silicon and nitride is removed. The steps of removing a second portion of the layer of silicon nitride and/or removing the second portion of the first layer of poly-silicon and/or removing at least a fraction of a thickness of the second portion of the first gate oxidation sub-layer precursor can include etching.

Figure 19:
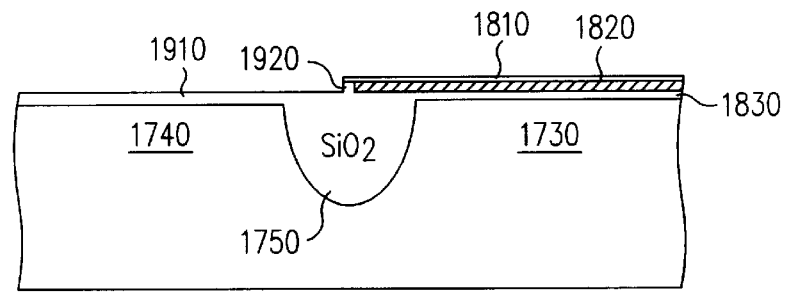
FIG. 19 illustrates a schematic view of a second step of gate oxidation, representing an embodiment of the invention.

FIG. 19 depicts growing a second gate oxidation sub-layer 1910 over the second gate region 1740. In this embodiment, the second gate oxidation sub-layer 1910 should be thicker than the first gate oxidation sub-layer 1830 to help prevent over etching during gate formation. The first gate oxidation sub-layer 1830 and the second gate oxidation sub-layer 1910 together compose a gate oxidation layer having different gate thicknesses. It can be appreciated that the growth of the second gate oxidation sub-layer 1910 in this embodiment results in the formation of a web of silicon oxide 1920 that rises from the oxide-filled trench 1750 toward the layer of silicon nitride 1810 due to oxidation of the exposed edge of the first poly-silicon sub-layer 1820.

Figure 20:
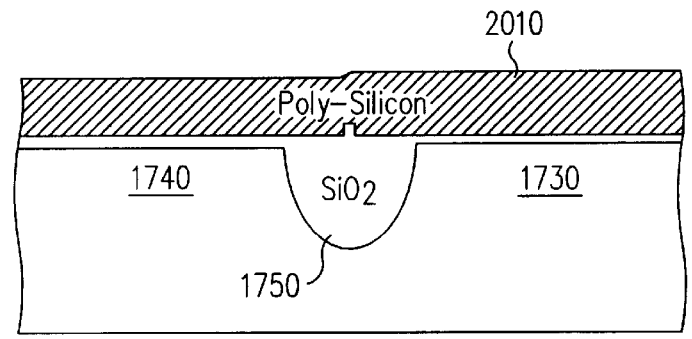
FIG. 20 illustrates a sequence of steps including the silicon nitride stripping and then poly-silicon deposition, representing an embodiment of the invention.

FIG. 20 depicts the STI device after several additional processing steps. These additional processing steps include removing the first portion of the layer of silicon nitride 1810. These additional steps also include forming a second poly-silicon sub-layer on both the second gate oxidation sub-layer and the first poly-silicon sub-layer, the first poly-silicon sub-layer and the second poly-silicon sub-layer together composing a poly-silicon layer 2010. The second poly-silicon sub-layer in this embodiment should be thicker than the first poly-silicon sub-layer; it can be advantageous to make the first poly-silicon sub-layer as thin as practical (possible). Again, gate oxides with two different thicknesses are formed.

A layer of silicide (not shown) can be formed by depositing a layer of metal on top of the poly-silicon layer 2010 and then heating to produce the silicide. The deposition of metal and heating are optional steps.

Practical Applications of the Invention

A practical application of the invention that has value within the technological arts is the formation of gate oxide regions of different thicknesses in conjunction with local oxidation of silicon in the context of memory, logic, and/or microprocessors. Another practical application of the invention that has value within the technological arts is the formation of gate oxide regions of different thicknesses in conjunction with shallow trench isolation in the context of memory, logic, and/or microprocessors. There are virtually innumerable uses for the invention, all of which need not be detailed here.

Advantages of the Invention

A method of forming a plurality of gate oxide thicknesses, representing an embodiment of the invention, can be cost effective and advantageous for at least the following reasons. The invention provides better cleanliness, thereby yielding a better gate oxide compared to conventional processes. The invention improves device uniformity and results in better oxide quality compared to conventional processes. The invention provides gate oxides of different thicknesses without adversely affecting carrier mobility.

All the disclosed embodiments of the invention described herein can be realized and practiced without undue experimentation. Although the best mode of carrying out the invention contemplated by the inventors is disclosed above, practice of the invention is not limited thereto. Accordingly, it will be appreciated by those skilled in the art that the invention may be practiced otherwise than as specifically described herein.

For example, the individual components need not be formed in the disclosed shapes, or assembled in the disclosed configuration, but could be provided in virtually any shape, and assembled in virtually any configuration. Further, the individual components need not be fabricated from the disclosed materials, but could be fabricated from virtually any suitable materials. Further, although the gate oxide fabrication process described herein can be a temporally separate process, it will be manifest that the gate oxide fabrication process may be as a subprocess integrated into a larger process with which it is associated. Furthermore, all the disclosed elements and features of each disclosed embodiment can be combined with, or substituted for, the disclosed elements and features of every other disclosed embodiment except where such elements or features are mutually exclusive.

It will be manifest that various additions, modifications and rearrangements of the features of the invention may be made without deviating from the spirit and scope of the underlying inventive concept. It is intended that the scope of the invention as defined by the appended claims and their equivalents cover all such additions, modifications, and rearrangements. The appended claims are not to be interpreted as including means-plus-function limitations, unless such a limitation is explicitly recited in a given claim using the phrase "means-for." Expedient embodiments of the invention are differentiated by the appended subclaims.

What is claimed is:

1. A method for forming gate oxides of different thicknesses, comprising:

growing a first gate oxidation sub-layer precursor on a silicon substrate having a first gate region separated from a second gate region by a local oxidation of silicon field;

depositing a first layer of poly-silicon on said first gate oxidation sub-layer precursor;

masking a first portion of said first layer of poly-silicon that overlies both i) a first portion of said first gate oxidation sub-layer precursor and ii) said first gate region;

removing a) a second portion of said first layer of poly-silicon that overlies both a second portion of said first gate oxidation sub-layer precursor and said second gate region so as to form a first poly-silicon sub-layer and b) at least a fraction of a thickness of said second portion of said first gate oxidation sub-layer precursor that overlies said second gate region so as to form a first gate oxidation sub-layer;

growing a second gate oxidation sub-layer precursor on both I) said first poly-silicon sub-layer and ii) a portion of said first gate oxidation sub-layer that overlies said second gate region;

depositing a second layer of poly-silicon on said second gate oxidation sub-layer precursor;

masking a first portion of said second layer of poly-silicon that overlies said second gate region;

removing a second portion of said second layer of poly-silicon that overlies said first gate region so as to form a second poly-silicon sub-layer having a gap, said first poly-silicon sub-layer and said second poly-silicon sub-layer together composing a poly-silicon layer;

filling the gap in said second layer of poly-silicon with an oxide; and removing a portion of said second gate oxidation sub-layer precursor that overlies said first gate region by etching back so as to form a second gate oxidation sub-layer, said first gate oxidation sub-layer and said second gate oxidation sub-layer together composing a gate oxidation layer having gate oxides of different thicknesses.

2. The method of claim 1, wherein a thickness of the first poly-silicon sub-layer is substantially equal to a thickness of the second poly-silicon sub-layer.

3. The method of claim 1, further comprising: forming a layer of silicide on both said first poly-silicon sub-layer and said second poly-silicon sub-layer.

4. The method of claim 1, wherein the gap is located over the local oxidation of silicon field.

5. The method of claim 1, wherein removing a) said second portion of said first layer of poly-silicon that overlies said second gate region so as to form a first poly-silicon sub-layer and b) at least a fraction of said thickness of a second portion of said first gate oxidation sub-layer precursor that overlies said second gate region so as to form a first gate oxidation sub-layer includes etching.

6. The method of claim 1, wherein removing a second portion of said second layer of poly-silicon that overlies said first gate region so as to form a second poly-silicon sub-layer includes etching.

7. The method of claim 1, wherein removing a portion of said second gate oxidation sub-layer precursor that overlies said first gate region includes etching.

8. A method for forming gate oxides of different thicknesses, comprising:

growing a first gate oxidation sub-layer precursor on a silicon substrate having a first gate region separated from a second gate region by an oxide filled trench;

forming a first layer of poly-silicon on said first gate oxidation sub-layer;

masking a first portion of said first layer of poly-silicon that overlies both i) a first portion of said first gate oxidation sub-layer precursor and ii) said first gate region;

removing a) a second portion of said first layer of poly-silicon that overlies both a second portion of said first gate oxidation sub-layer precursor and said second gate region so as to form a first poly-silicon sub-layer and b) at least a fraction of a thickness of said second portion of said first gate oxidation sub-layer precursor that overlies said second gate region so as to form a first gate oxidation sub-layer;

growing a second gate oxidation sub-layer precursor i) on said first poly-silicon sub-layer ii) and over said second gate region;

forming a second layer of poly-silicon on said second gate oxidation sub-layer precursor;

removing a portion of said second layer of poly-silicon that overlies said first gate region by chemical mechanical polishing so as to form a second poly-silicon sub-layer, said first poly-silicon sub-layer and said second poly-silicon sub-layer together composing a poly-silicon layer; and removing a portion of said second gate oxidation sub-layer precursor that overlies said first gate region so as to form a second gate oxidation sub-layer, said first gate oxidation sub-layer and said second gate oxidation sub-layer together composing a gate oxidation layer.

9. The method of claim 8, wherein a thickness of the first poly-silicon sub-layer is substantially equal to a thickness of the second poly-silicon sub-layer.

10. The method of claim 8, further comprising: forming a layer of silicide on both said first poly-silicon sub-layer and said second poly-silicon sub-layer.

11. The method of claim 8, wherein removing a second portion of said first layer of poly-silicon that overlies both a second portion of said first gate oxidation sub-layer precursor and said second gate region so as to form a first poly-silicon sub-layer includes etching.

12. The method of claim 8, wherein removing at least a fraction of a thickness of said second portion of said first gate oxidation sub-layer precursor that overlies said second gate region so as to form a first gate oxidation sub-layer includes etching.

13. The method of claim 8, wherein removing a portion of said second layer of poly-silicon that overlies said first gate region by chemical mechanical polishing so as to form a second poly-silicon sub-layer includes etching.

14. The method of claim 8, wherein removing a portion of said second gate oxidation sub-layer precursor that overlies said first gate region so as to form a second gate oxidation sub-layer includes etching.

\* \* \* \* \*